United States Patent
Tzur et al.

(10) Patent No.: US 8,160,309 B1
(45) Date of Patent: Apr. 17, 2012

(54) METHOD, APPARATUS, AND SYSTEM FOR OBJECT RECOGNITION AND CLASSIFICATION

(75) Inventors: Meir Tzur, Haifa (IL); Victor Pinto, Zichron-Yaakov (IL)

(73) Assignee: CSR Technology Inc., San Jose, CA (US)

( * ) Notice: Subject to any disclaimer, the term of this patent is extended or adjusted under 35 U.S.C. 154(b) by 992 days.

(21) Appl. No.: 12/130,704

(22) Filed: May 30, 2008

Related U.S. Application Data

(60) Provisional application No. 61/016,199, filed on Dec. 21, 2007.

(51) Int. Cl.
*G06K 9/00* (2006.01)
*G06K 9/46* (2006.01)

(52) U.S. Cl. .................................. 382/118; 382/190
(58) Field of Classification Search .................... 382/118
See application file for complete search history.

(56) References Cited

U.S. PATENT DOCUMENTS

| | | | |
|---|---|---|---|
| 4,975,969 A | | 12/1990 | Tal |
| 5,012,522 A | | 4/1991 | Lambert |
| 5,164,992 A | * | 11/1992 | Turk et al. ............. 382/118 |
| 5,410,609 A | | 4/1995 | Kado et al. |
| 5,450,504 A | | 9/1995 | Calia |
| 6,088,059 A | | 7/2000 | Mihara et al. |
| 6,108,437 A | | 8/2000 | Lin |
| 6,285,799 B1 | | 9/2001 | Dance et al. |
| 6,429,415 B1 | | 8/2002 | Rhoads |
| 6,430,220 B1 | | 8/2002 | Determan |
| 6,567,570 B1 | | 5/2003 | Steinle et al. |
| 6,586,991 B2 | | 7/2003 | Masuda et al. |
| 6,657,566 B1 | | 12/2003 | Risbo et al. |
| 6,657,572 B2 | | 12/2003 | Lee et al. |
| 6,665,338 B1 | | 12/2003 | Midya et al. |
| 7,031,499 B2 | | 4/2006 | Viola et al. |
| 7,054,499 B2 | | 5/2006 | Watanabe |
| 7,061,415 B2 | | 6/2006 | Magrath |

(Continued)

OTHER PUBLICATIONS

Ce Liu; Hueng-Yeung Shum; , "Kullback-Leibler boosting," Computer Vision and Pattern Recognition, 2003. Proceedings. 2003 IEEE Computer Society Conference on , vol. 1, no., pp. I-587-I-594 vol. 1, Jun. 18-20, 2003.*

(Continued)

*Primary Examiner* — Bhavesh Mehta
*Assistant Examiner* — Utpal Shah
(74) *Attorney, Agent, or Firm* — Frommer Lawrence & Haug LLP; Jamie L. Wiegand

(57) ABSTRACT

A method of face recognition includes generating a recognition database for at least one identified face by obtaining multiple images for each identified face; selecting a subset of distinctive features for each identified face from a set of features, where each of the distinctive features in the subset have at least one calculated value representative of that distinctive feature of the identified face that exceeds a threshold level of distinction from at least one corresponding calculated value for a reference set of faces, and, for each identified face, recording in the recognition database the selected subset of distinctive features. To recognize an image of an unidentified face, a comparison metric is calculated for at least one identified face in the recognition database comparing at least a portion of the selected subset of distinctive features of that identified face with corresponding features for the unidentified face. The comparison metric for that identified face is used to determine if there is a correlation between the unidentified face and the identified face.

27 Claims, 3 Drawing Sheets

U.S. PATENT DOCUMENTS

| | | | |
|---|---|---|---|
| 7,170,360 | B2 | 1/2007 | Braun |
| 7,206,563 | B1 | 4/2007 | Danielson et al. |
| 7,209,002 | B2 | 4/2007 | Ohkuri et al. |
| 7,224,728 | B2 | 5/2007 | Komamura |
| 7,245,767 | B2 | 7/2007 | Moreno et al. |
| 7,450,745 | B2 | 11/2008 | Dowski et al. |
| 7,453,653 | B2 | 11/2008 | Dowski et al. |
| 7,639,896 | B2 * | 12/2009 | Sun et al. ............ 382/294 |
| 7,659,778 | B2 | 2/2010 | Vainsencher |
| 7,684,651 | B2 * | 3/2010 | Tang et al. ............ 382/305 |
| 7,742,239 | B2 | 6/2010 | Bell |
| 7,852,350 | B2 | 12/2010 | Barone et al. |
| 7,881,551 | B2 | 2/2011 | Paik et al. |
| 8,009,197 | B2 | 8/2011 | Ben-Ezra et al. |
| 2004/0252201 | A1 | 12/2004 | Meitav et al. |
| 2005/0047672 | A1 | 3/2005 | Ben-Ezra et al. |
| 2005/0058361 | A1 | 3/2005 | Tajima |
| 2005/0083517 | A1 | 4/2005 | Asad et al. |
| 2005/0110667 | A1 | 5/2005 | Borisavljevic |
| 2005/0246105 | A1 * | 11/2005 | Faber et al. ............ 702/19 |
| 2005/0285670 | A1 | 12/2005 | Ohkuri et al. |
| 2006/0029291 | A1 * | 2/2006 | Sun et al. ............ 382/294 |
| 2006/0034365 | A1 | 2/2006 | Song et al. |
| 2006/0072657 | A1 | 4/2006 | Putzeys |
| 2006/0098237 | A1 | 5/2006 | Steinberg et al. |
| 2006/0110147 | A1 | 5/2006 | Tomita et al. |
| 2006/0125938 | A1 | 6/2006 | Ben-Ezra et al. |
| 2007/0009169 | A1 | 1/2007 | Bhattacharjya |
| 2007/0014554 | A1 | 1/2007 | Sasaki et al. |
| 2007/0058073 | A1 | 3/2007 | Steinberg et al. |
| 2007/0065130 | A1 | 3/2007 | Fukumoto et al. |
| 2007/0104362 | A1 * | 5/2007 | Hwang et al. ............ 382/159 |
| 2007/0201732 | A1 | 8/2007 | Wahlsten |
| 2007/0286514 | A1 | 12/2007 | Brown et al. |
| 2008/0203276 | A1 | 8/2008 | Dowski et al. |
| 2008/0253623 | A1 * | 10/2008 | Hauke ............ 382/118 |
| 2009/0060373 | A1 | 3/2009 | Perera et al. |
| 2011/0032392 | A1 | 2/2011 | Litvinov et al. |

OTHER PUBLICATIONS

Coetzee, "Correcting Kullback-Leibler distance for feature selection," Journal Pattern Recognition Letters, vol. 26 Issue 11, Aug. 2005.*

Chung, Albert C.S. et al., "Multi-Modal Image Registration by Minimising Kullback-Leibler Distance," T. Dohi and R. Kikinis (Eds.): MICCAI 2002, LNCS 2489, pp. 525-532, 2002.

Gupta, Abhinav et al., "Computational Models for Object Detection and Recognition," May 2004, 12 pages.

Papageorgiou, C. P. et al., "A General Framework for Object Detection," Sixth International Conference on Computer Vision, 1998, pp. 555-562.

Pilpre, Arnaud, "Self- Properties of Multi Sensing Entities in Smart Environments," Thesis Submitted May 6, 2005 for the degree of Master of Science, Massachusetts Institute of Technology, Jun. 2005.

Viola, Paul et al., "Robust Real-Time Face Detection," International Journal of Computer Vision, 2004, 57(2):137-154.

Pascual, C. et al., "High-Fidelity PWM Inverter for Audio Amplification Based on Real-Time DSP," University of Illinois, Jun. 19, 2002, pp. 1-32.

Hawksford, M. "Modulation and System Techniques in PWM and SDM Switching Amplifiers," J. Audio Eng. Soc., vol. 54, No. 3, Mar. 3, 2006, pp. 107-139.

Hawksford, M. O. J., "Time-Quantized Frequency Modulation, Time-Domain Dither, Dispersive Codes and Parametrically Controlled Noise Shaping in SDM," J. Audio Eng. Soc., vol. 52, Jun. 6, 2004, pp. 587-617.

Trehan, C., "High Performance Class-D Amplifiers," Texas Tech University, May 2007, pp. 1-152.

Kiss, P. et al., "Stable High-Order Delta-Sigma Digital-to-Analog Converters," IEEE Transactions on Circuits and Systems: Regular Papers, vol. 51, No. 1, Jan. 2004, pp. 200-205.

Official Communication for U.S. Appl. No. 12/186,232 mailed Nov. 16, 2009.

Primot, J. et al., "Deconvolution from Wave-front Sensing: A New Technique for Compensating Turbulence-degraded Images," The Journal of the Optical Society of America, Sep. 1990, 7:1598-1608.

Raskar, R. et al., "Coded Exposure Photography: Motion Deblurring Using Fluttered Shutter," ACM Transactions on Graphics (TOG), Jul. 2006, 25(3):795-804.

Rabie, T. et al., "Adaptive-neighborhood Image Deblurring," Journal of Electronic Imaging, Oct. 1994, 3 (4):368-378.

Pham, T. Q. et al., "Influence of Signal-to-Noise Ratio and Point Spread Function on Limits of Super-Resolution," Image Processing: Algorithms and Systems IV, 2005, SPIE-IS&T vol. 5672, pp. 169-180.

Neyt, X. et al., "Directionally Adaptive Image Resolution," 1996, 5 pages.

Lagendijk, R. L. et al., "Basic Methods for Image Restoration and Identification," Feb. 15, 1999, 25 pages.

Gonzalez, R. C. et al, "Digital Image Processing, Second Edition" (Addison-Wesley Publishing Company: Reading, MA) 1987, pp. 334-338.

Farsiu, S. et al., "Robust Shift and Add Approach to Super-Resolution," International Symposium on Optical Science and Technology, SPIE, Aug. 2003, San Diego, CA, 5203 121-130.

Ben-Ezra, M. et al., "Motion Deblurring using Hybrid Imaging," (Computer Science Department, Columbia University, New York, NY) IEEE 2003, 8 pages.

Ben-Ezra, M. et al., "Motion-Based Motion Deblurring," IEEE Transactions on Pattern Analysis and Machine Intelligence, Jun. 2004, 26(6):689-698.

Banham, M. R. et al., "Digital Image Restoration," IEEE Signal Processing Magazine, Mar. 1997, 24-41.

Office Communication for U.S. Appl. No. 12/130,733 mailed Jul. 15, 2011.

Office Communication for U.S. Appl. No. 12/130,993 mailed Jul. 15, 2011.

* cited by examiner

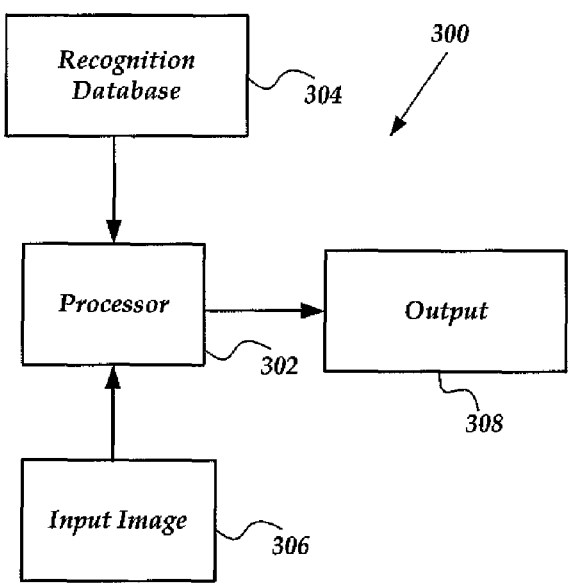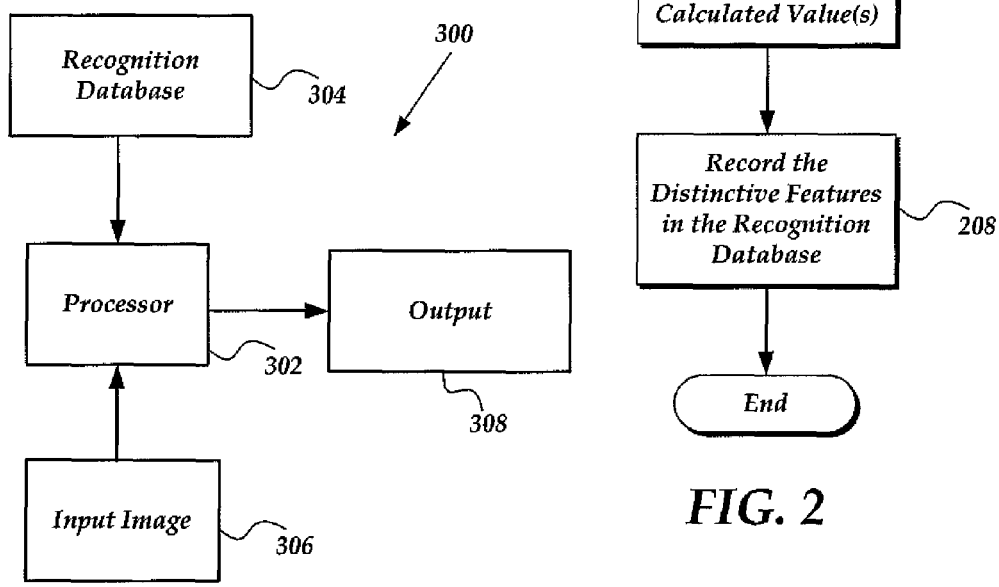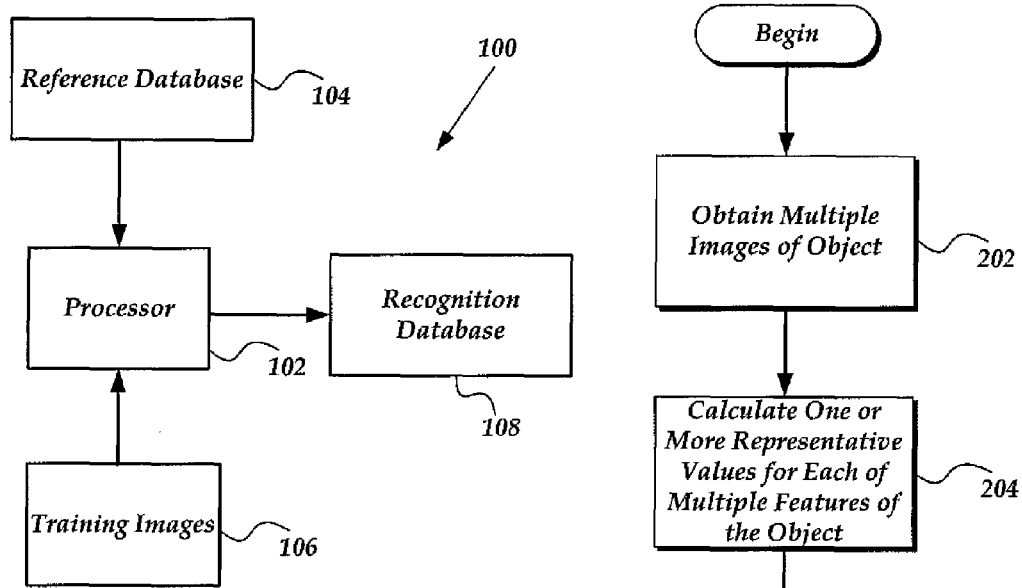

METHOD, APPARATUS, AND SYSTEM FOR OBJECT RECOGNITION AND CLASSIFICATION

CROSS REFERENCE TO RELATED APPLICATIONS

This application claims the benefit of U.S. Provisional Application No. 61/016,199 filed Dec. 21, 2007, herein incorporated by reference in its entirety.

FIELD

The present invention is directed to methods, apparatuses, and systems for object recognition. The present invention is also directed to methods, apparatuses, and systems for object recognition by comparing features of an object, such as a face, with identified subsets of distinctive features for the objects in a recognition database.

BACKGROUND

Digital cameras have become ubiquitous and can be used to take both still images and video images. Object recognition, and, in particular, face recognition, is a desirable feature for digital cameras. It can also be desirable to provide object recognition, and, in particular, face recognition, with other devices, such as computers, personal data assistants (PDAs), mobile telephones, and the like. In some instances, these devices may include a digital camera. In other instances, the devices may receive a still or video image and perform object recognition on the image.

Face recognition is also closely associated with face detection, in which a generic face is sought in an image. Face recognition goes a step further, seeking to classify a face detected in an image as a particular face from a database of previously identified faces desired to be found.

In many conventional methods, faces are recognized by determining the Euclidean distance between the features of an input face image and the features of a set of reference face images (e.g., a gallery or library of face images.) The identity of the input face image is determined to be the reference face which is least distant and is below a minimum threshold of detection. Other mathematical methods, such as principal component analysis (PCA) or linear discriminant analysis (LCA) have been used to reduce the computational load of the analysis and to improve the robustness of recognition.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description, which is to be read in association with the accompanying drawings, wherein:

FIG. 1 is a schematic illustration of one embodiment of a system for generating a recognition database, according to the invention;

FIG. 2 is a flowchart illustrating one embodiment of a method of generating entries for a recognition database, according to the invention;

FIG. 3 is a schematic illustration of one embodiment of a system for object recognition using a recognition database, according to the invention;

DETAILED DESCRIPTION

Figure 4:
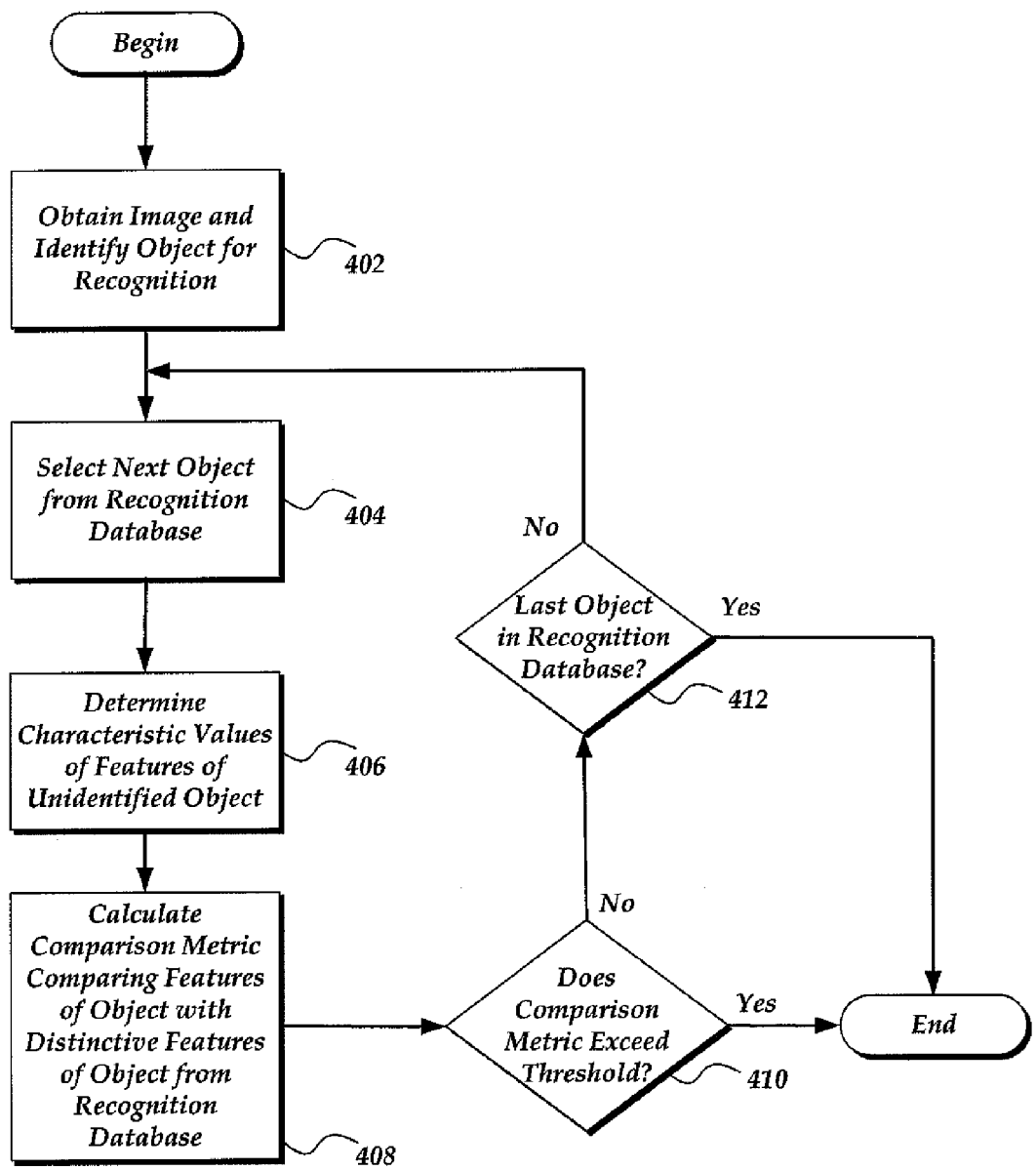
FIG. 4 is a flowchart illustrating one embodiment of a method of recognizing an object, according to the invention.

The present invention now will be described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. Among other things, the present invention may be embodied as methods or devices. Accordingly, the present invention may take the form of an entirely hardware embodiment, an entirely software embodiment or an embodiment combining software and hardware aspects. The following detailed description is, therefore, not to be taken in a limiting sense.

Throughout the specification and claims, the following terms take the meanings explicitly associated herein, unless the context clearly dictates otherwise. The phrase "in one embodiment" as used herein does not necessarily refer to the same embodiment, though it may. Furthermore, the phrase "in another embodiment" as used herein does not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

Briefly stated, the present invention is directed toward object recognition including, for example, face recognition. A recognition system is trained to recognize a gallery of one or more identified objects (e.g., faces) which form a recognition database. To train the system, several images of an identified object are provided and the system determines one or more characteristic values (e.g., the mean value and variance) for each of multiple features of the object. Based on these characteristic values, a subset of distinctive features is selected for the object from a set of available features and this subset is stored in a recognition database. Different objects may have different subsets of distinctive features. The distinctive features for each object can be, for example, features that are substantially distinctive (e.g., are the greatest distance) from a set of generic features determined using a set of reference objects. For example, a reference library of faces can be used to determine a set of generic features and, in at least some instances, statistical values, such as a mean value and a variance, for the generic features. Distinctive features for a particular face could include those features that exceed a threshold level of distinction over the generic features determined from the reference library. Accordingly, each object or face in the recognition database is represented by a subset of distinctive features that are particularly distinguishing for that object.

To recognize an input object, the features of the input object are compared to the subset of distinctive features for each (or at least for some) of one or more objects in the recognition database. A comparison metric is calculated and if the comparison metric is exceeds a threshold value then it is determined that the input object corresponds to that object in the recognition database. An advantage of these recognition systems and methods over conventional systems and methods is that particularly distinguishing features are identified for each object in the recognition database and these features are compared to the input object. This reduces the calculation time and complexity with respect to conventional systems and methods which consider all of the available features.

Object Recognition

For purposes of illustration, the discussion below will use face recognition as an illustrative example. The terms "face" and "object" may be used interchangeably in the discussion. It will be recognized, however, that the methods, systems, and devices discussed below can be used to recognize objects other than faces and that the application of these methods, systems, and devices to those other objects will be readily understood. Examples of other objects include, but are not limited to, bodies, patterns, pets, cars, eye iris, finger prints, and the like.

FIG. 1 illustrates schematically one embodiment of a system 100 for generating a recognition database. The system 100 includes a processor 102, a reference database 104, training images 106, and a recognition database 108. Any suitable processor 102 can be used. The processor 102 may be part of a computer, camera, mobile telephone, PDA, or any other device. Alternatively, the processor 102 may be remotely accessible using one or more of these devices and a wireless or wired (or any combination thereof) connection. For example, the training images 106 may be provided to, or generated by, a computer, camera, mobile telephone, or PDA and this device could remotely connect to a processor that generates, or modifies, the recognition database (which may be stored on the device or may also be remote to the device).

The processor 102 may be located in the same device as one, or either, of the reference database 104 and the recognition database 108. Alternatively, one, or both, of the reference database 104 and recognition database 108 may be remote to the processor 102.

The reference database 104 can be, for example, a database of faces. Alternatively or additionally, the reference database can be a database of characteristic values (e.g., mean and variance) for a set of features, where such characteristic values are generated from a reference set of faces. The reference database 104 can, in at least some embodiments, include both the faces and the characteristic values of the features.

The faces in the reference database, or the reference set of faces used to generate the values in the reference database, can be a selection of faces representing variation in human facial features. Alternatively, the faces may be selected based on one or more characteristics such as, for example, gender, age (e.g., child or adult; child, teen, adult, or elderly), race, demographics (for example, a selection of faces for a reference database used in Japan might be different then the selection of faces for the United States), and the like. Other selections of faces for the reference database can also be made; for example, the selection of faces may be made by, for example, a device user or a device manufacturer or third party software supplier.

Characteristic values can be determined for a set of features from the faces in the reference database or from the reference set of faces used to generate the reference database. Examples of suitable features for face recognition include, but are not limited to, the known Haar or Haar-like features. (See, for example, P. Viola and M. J. Jones, "Robust Real-time Face Detection", International Journal of Computer Vision 57(2), 137-154 (2004) and C. Papageorgiou, M. Oren and T. Poggio, "A General Framework for Object Detection", Proceedings of the 6th International Conference on Computer Vision, 555-562 (1998), both of which are incorporated herein by reference.) Such features may include, but are not limited to, the shape, size, relative dimensions (e.g., length versus width of a rectangle or major axis versus minor axis of an ellipse), or area of facial features; or comparisons of shape, size, relative dimensions, or area between facial features and the like. Any set of features can be used.

The set of features can include any number of features. Preferably, the set of features includes many different features. For example, the set of features may include at least 10, 20, 50, 100, 200, 500, 1000, 10000, or more features. The set of features may be selected from among a larger group of possible features for consideration.

The set of features can be identified by one or more characteristic values that can used to determine the subset of distinctive features for each object in the recognition database. Such characteristic values can be, for example, statistical values determined from the faces in the reference database or the reference set of faces used to generate the reference database. Such statistical values can include the mean, variance, median, higher order statistics, and the like of the faces. In at least one embodiment, the mean $\mu_j$ and variance $\sigma^2_j$ of each feature ($j=1, \ldots, n$; where n is the number of features in the set of features) can be determined according to the following equations:

$$\mu_j = \frac{1}{N} \sum_{i=1}^{N} f_i$$

$$\sigma^2_j = \frac{1}{N-1} \sum_{i=1}^{N} (f_i - \mu_j)^2$$

where N is the number of faces in the reference database or the reference set of faces from which the reference database is generated. In other embodiments, higher order statistics may be used in addition to, or instead of, the mean and variance.

The system 100 can be trained to recognize a face. For each face to be added to the recognition database, multiple training images 106 of the identified face are provided to the processor 102 which then determines a subset of distinctive features, selected from the set of features, that will be recorded in the recognition database 108 for that particular face. FIG. 2 is a flow chart illustrating one embodiment of a method of training a system to recognize a particular object, such as a particular face. First, multiple images of the object are obtained (step 202). Preferably, these images are not identical but rather show the object from different positions, distances, angles, etc.

For each of multiple features of the object, one or more values, representative of that feature, are calculated using the multiple images of the object (step 204). As an example, the value(s) can be statistical values, for example, the mean value and variance for that feature of the object as determined from the training images. The features for which value(s) are calculated can be any, or all, of the set of features described above. For example, value(s) may be calculated for any, or all, of the set of features catalogued in a reference database and may even include other features. For purposes of illustration of the method, the discussion below uses the mean and variance values for each of the features, but it will be understood that other characteristic values (or the mean or variance alone) could be used in addition to the mean and variance or as an alternative.

Using the value(s) determined for the features from the multiple images, a subset of distinctive features is determined for the object (e.g., face) (step 206) and this subset of distinctive features is provided to the recognition database (step 208). Any method and any criteria can be used to select the distinctive features which are a subset of the features for which the values were calculated in step 204 above. Preferably, the distinctive features include features for which there is substantial statistical variation of that feature of the individual object from the aggregate generic features of the objects in the reference database. In at least some embodiments, the features with the most substantial statistical variation from the features determined for the objects in the reference database are selected. In other embodiments, the distinctive features are not necessarily those with the most variation from the features in the reference database, but still exhibit substantial variation.

Any number of distinctive features can be selected for a particular object. For example, at least 1, 2, 3, 4, 5, 8, 10, 12, 16, 20, 24, 32, 64, 100 or more distinctive features can be selected for the subset of distinctive features for an object. The number of distinctive features for each object in the recognition database can be the same or that number can vary for different objects. Typically, the number of distinctive feature selected is no more than one half, one third, one quarter, one tenth, one twentieth, one fiftieth, or one hundredth, of the features available for selection. Often, different subsets of distinctive features will be selected for objects in the recognition database (although there may be instances where the same subset is selected for two or more objects).

Any criteria for selecting distinctive features that utilizes the calculated value(s) from the training images and corresponding values from the reference database (or determined from the faces in the reference database) can be used. As an example, a distinctive feature for a particular object may have a mean value determined from the training images that is statistically different from the mean value of that feature for the objects in the reference database. As another example, a set of distinctive features might include features of the individual object in the training images that differ by at least one standard deviation (or 1.5 or two or 2.5 standard deviations) from the mean value of that feature from the reference database.

As another example, in at least some embodiments, the Kullback-Leibler divergence is used to select at least some (or all) of the distinctive features. This analysis is designed to measure the distance between two given probability distributions. For two continuous probability distributions p and q, the divergence $D(p|q)$ (a comparison metric) can be defined as:

$$D(p \mid q) = \int_{-\infty}^{\infty} p(x) \log\left(\frac{p(x)}{q(x)}\right) dx$$

If $D(p|q)$ is not symmetric, (i.e., $D(p|q) \neq D(q|p)$), a symmetric version may be used instead:

$$D = D(p|q) + D(q|p)$$

In at least some embodiments, the features in, or calculated from faces in, the reference database are assumed to have a normal (Gaussian) distribution. Therefore, given the mean and variance of the feature, the probability distribution is exactly defined. In other embodiments, a non-Gaussian distribution can be used for one or more (or even all) of the features. The following discussion assumes a Gaussian distribution, but application to a non-Gaussian distribution will be readily understood.

The distribution for the each feature can also be determined for the specific face in the training images. Again, if a normal distribution is assumed, the mean and variance of the feature describe the distribution.

The individual divergence D can be calculated for each feature of interest, assuming $p(x)$ is the distribution of that feature for a general face and $q(x)$ is the distribution of that feature for the particular face in the training images. For the case of normal distribution of $p(x)$ and $q(x)$, $D(p|q)$ depends only on the mean values and variances of the two distributions.

The features can be sorted according to their D value. From a large set of N features, a smaller subset of M distinctive features can be selected by selecting some or all of the features for which D has minimum or relatively low values.

Another embodiment of a method for selecting the distinctive features employs the probability of detection and the probability of false positives for selecting the distinctive features. Again, in at least some embodiments normal distributions are assumed (although in other embodiments other distributions can be used) where $p(x)$ the distribution of the particular feature for a general face and $q(x)$ is the distribution of the particular feature for the face in the training images. In such a case, using a ML (maximum likelihood) criterion, the probability of detection of a particular feature for the particular face in the training images can be calculated as:

$$P_d = \int_{x_1}^{x_2} p(x) dx$$

where $x_1$ and $x_2$ are determined from the ML equation:

$$\frac{(x - \mu_1)^2}{\sigma_1^2} - \frac{(x - \mu_2)^2}{\sigma_2^2} - 2 \cdot \log\left(\frac{\sigma_2}{\sigma_1}\right) = 0$$

and where $\mu_1$, $\sigma_1^2$ correspond to the general face statistics for that particular feature and $\mu_2$, $\sigma_2^2$ correspond to the face statistics for the face in the training images and for the particular feature.

The probability of false positives (i.e., the probability to decide that a face matches the face in the training images when in fact it does not) can be calculated as:

$$P_{fp} = \int_{x_1}^{x_2} q(x) dx$$

A comparison metric D for each of the features of interest can be calculated using the following equation:

$$D = \alpha(1 - P_d) + (1 - \alpha) P_{fp}$$

where α is a constant between zero and one and can be selected and represents a trade-off between less stringent requirements for recognition of the face and the chance of obtaining a false positive. In at least some embodiments, α is in the range of 0.2 to 0.8 or in the range of 0.3 to 0.7 or in the range of 0.4 to 0.6.

The features can be sorted according to their D value. From a large set of N features, a smaller subset of M distinctive features can be selected by selecting some or all of the features for which D has minimum or relatively low values.

It will be recognized that other criteria and comparison metrics D can be used. For example, cumulative distribution functions calculated for the reference set of faces and the face in the training images can be used to select the distinctive features. Other methods for selecting statistically distinctive values also known and can be used to assist in selecting the distinctive features.

As another example, another comparison metric D for use in selecting distinctive features can be written as:

$$D = \sum_{i=1}^{L} p_i(x)$$

where L is the number of examples for face in the training image and $p_i(x)$ is the value of the probability distribution for a particular feature x and for the generic features from the reference database. Features can be selected as distinctive features if they attain relatively low values of D.

In at least some embodiments, parameters may be determined for each distinctive feature. These parameters can be used to compare the previously identified object from the training images with an unknown object. These parameters may be stored in the recognition database or may be calculated based on information, such as means and variances, stored in the recognition database. As an example, two parameters $a_i$ and $b_i$ of a parabolic sensitivity function for each distinctive feature i can be determined.

In one embodiment, these parameters are based on the maximum likelihood criterion. The parameters for a distinctive feature i can then be given by the equations:

$$a_i = \sigma_2^2 - \sigma_1^2$$

$$b_i = 2\mu_2\sigma_1^2 - 2\mu_1\sigma_2^2$$

where $\mu_1$, $\sigma_1^2$ correspond to the general face statistics for the distinctive feature and $\mu_2$, $\sigma_2^2$ correspond to the particular face statistics for the distinctive feature.

The recognition database can be used to detect and recognize faces in input images by employing the recognition database. FIG. 3 illustrates one embodiment of a system 300 for face recognition including a processor 302, a recognition database 304, and one or more input images 306. The processor 302 uses the recognition database 304 and input image(s) 306 to generate an output 308. In at least some instances, the output is provided on a display as text, graphic, image, or any combination thereof.

Any suitable processor 302 can be used and the processor can be the same as the processor 102 in FIG. 1 or it can be a different processor. The processor 302 may be part of a computer, camera, mobile telephone, PDA, or any other device. Alternatively, the processor 302 may be remotely accessible using one or more of these devices and a wireless or wired (or any combination thereof) connection. For example, the input image 306 may be provided to, or generated by, a computer, camera, mobile telephone, or PDA and this device could remotely connect to a processor that generates the output (which may be stored or displayed on the device or any other device or display).

The processor 302 may be located in the same device as the recognition database 304. Alternatively, the recognition database 304 may be remote to the processor 302.

The recognition database is used for recognition of an object in an input image. FIG. 4 illustrates one embodiment of a method of object recognition. First, the input image is obtained and an object is identified for recognition (step 402). For example, a face may be identified in the image (e.g., selected from multiple faces).

The unknown object is then individually compared to one or more previously identified objects from the recognition database (step 404). One of the objects of the recognition database is selected and, for one or more (and, preferably, each) of the distinctive features of the object of the recognition database, one or more characteristic values representative of that features of the unidentified object can then be determined (step 406). Alternatively, the characteristic values for all, or part, of the possible features may be determined prior to selecting the object from the recognition database.

A comparison metric is calculated comparing all of the distinctive features (or at least a subset of the distinctive features) of the object from the recognition database with those same features of the unidentified object (step 408). Any known method or metric for comparing two subsets of value to determine if they are statistically (or otherwise) similar can be used. After calculating the comparison metric, it can then be determined if the comparison metric exceeds a threshold value indicating that the distinctive features of the object from the recognition database and the corresponding features of the unidentified object are sufficiently similar (step 410). In some instances, "exceeding a threshold value" means a value less than a threshold value and, in other instances, it means a value greater than a threshold value—whichever indicates that the object from the recognition database and the unidentified object are the same. If the comparison metric does exceed the threshold value, then the process may halt. Alternatively, the process can continue to consider other objects in the recognition database even if the comparison metric exceeds the threshold value.

If the comparison metric does not exceed the threshold value, then a new object from the recognition database is selected (steps 412 and 404). The process can be used to compare the unidentified object to all of the objects in the recognition database, or to only a subset of the objects in the recognition database (e.g., a subset of objects selected by a user).

One embodiment of a comparison metric is a distance metric (such as a Euclidian distance) between features of the one or more objects in the recognition database and the same features of the input image. For example, the individual differences in values (or normalized differences in values) for an object in the recognition database and the input image for each of the features can be added to provide a distance metric. If the distance is less than a threshold value, the input image can be recognized as the corresponding object in the recognition database.

Another embodiment of a comparison metric uses the parameters $a_i$ and $b_i$ described above. A comparison metric $F_j$ can be calculated for the object j in the recognition database using the following equation:

$$F_j = \sum_{i=1}^{M_j} a_{j,i} f_i^2 + b_{j,i} f_i$$

where $a_{j,i}$ and $b_{j,i}$ are the parameters described above for distinctive feature i of object j in the recognition database, $M_j$ is number of distinctive features of object j (or at least the number of distinctive features that will be considered in this calculation), and $f_i$ is the value of distinctive feature i of the unidentified object being compared to object j. If $F_j$ exceeds a threshold value T then the unidentified object is correlated to, or identified as, object j. If $F_j$ does not exceed the threshold value T then the unidentified object is not correlated to, or identified as, object j. In at least some embodiments, the threshold value T may be selected to represent an acceptable level of false positives and may be selected manually or calculated algorithmically. One example of an algorithm for calculating T is the following:

$$T = \sum_{i=1}^{M_j} c_{j,i}$$

where $$c_{j,i} = 2 \cdot \log\left(\frac{\sigma_2}{\sigma_1}\right) \sigma_1^2 \sigma_2^2 - \mu_1^2 \sigma_2^2 + \mu_2^2 \sigma_1^2$$

where $\mu_1$, $\sigma_1^2$ correspond to the general face statistics for the distinctive feature i of object j and $\mu_2$, $\sigma_2^2$ correspond to the particular face statistics for the distinctive feature i of object j.

In some embodiments, however, if $F_j$ for all objects in the recognition database fails to exceed the threshold value T then the object with the highest value of $F_j$ may be correlated to the unidentified object. In other embodiments, the output 308 from the processor 302 may indicate that the object was not recognized.

Illustrative Camera Device

Figure 5:
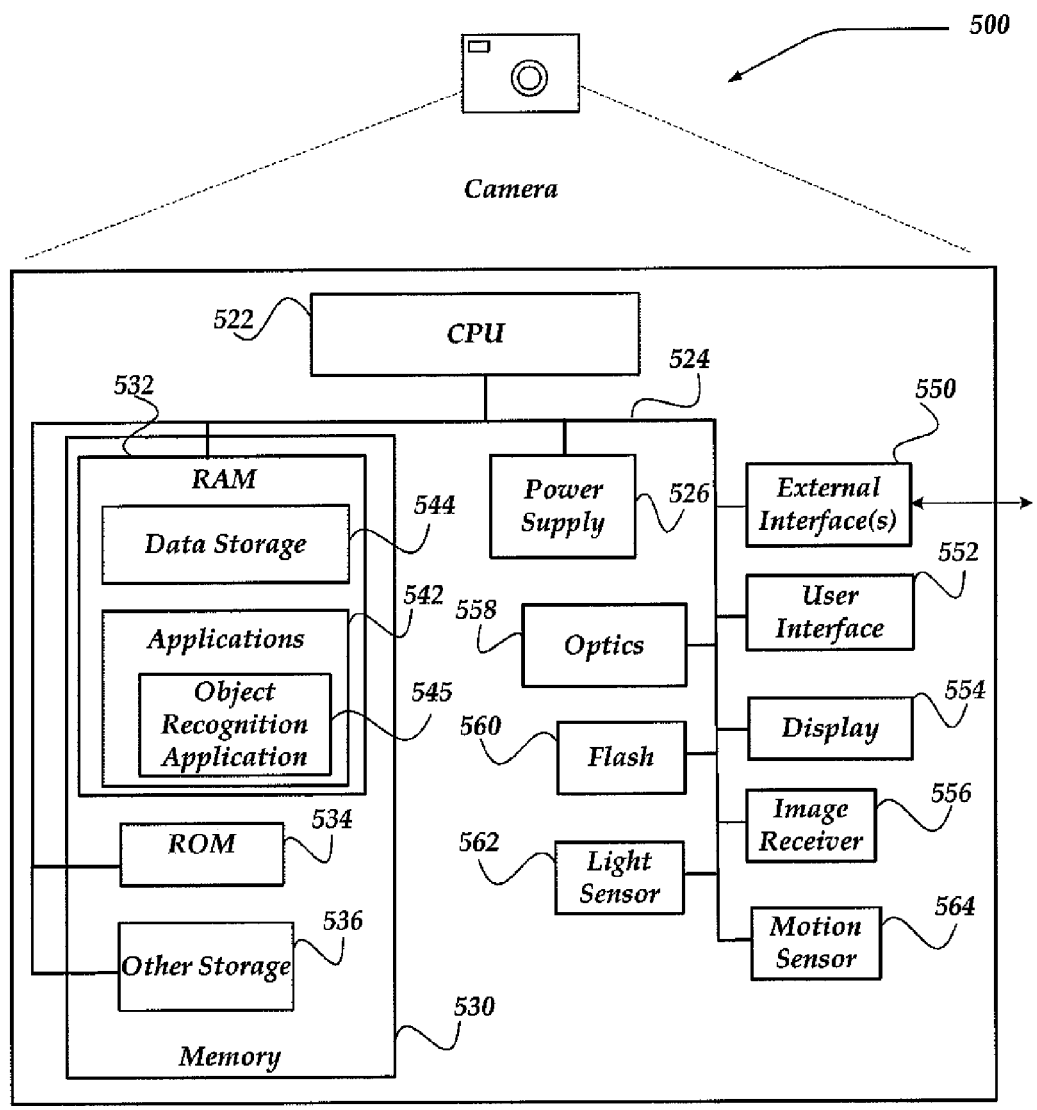
FIG. 5 is a schematic diagram of components of a camera useful for obtaining images for use in an object recognition system, according to the invention.

FIG. 5 shows one embodiment of a camera 500 that may be used in implementing the invention. Camera 500 may include more or fewer components than those shown in FIG. 5. However, the components shown are sufficient to disclose an illustrative embodiment. It will be understood, however, that the methods described above may be performed by camera 500 or may be performed, entirely or partially, by another device that receives an image captured by camera 500. Moreover, such a device may be used to process images that have been captured by a camera (or other image-capture device) substantially different from the camera illustrated in FIG. 5 including analog cameras that capture images on film. The images can be converted into digital representations by scanning or any other suitable method and can then be processed as described above for object recognition.

The camera 500 may be a camera for taking still pictures or motion pictures (e.g., a video camera). The camera 500 may be a stand-alone camera or may be part of a device such as, for example, a mobile phone, PDA, computer, and the like.

As shown in the figure, the camera 500 includes a processing unit (CPU) 522 in communication with a memory 530 via a bus 524. Camera 500 also includes a power supply 526, one or more external interfaces 550, a user interface 552, a display 554, an image receiver 556, optics (e.g., lens(es) and shutter) 558, a flash 560, a light sensor 562, and a motion sensor 564. Power supply 526 provides power to camera 500. A rechargeable or non-rechargeable battery may be used to provide power. The power may also be provided by an external power source, such as an AC adapter.

The optics 558 includes the lens(s), shutter, focusing apparatus, and other optical components that allow the camera to generate an image on the image receiver 556. Any suitable optical arrangement can be used. The image receiver 556 can be any suitable device for receiving the image and generating an electrical representation of the image including, but not limited to, an array of charge-coupled devices (CCD array) or array of CMOS detectors. Preferably, the image receiver generates a digital representation of the image, although it will be understood that analog image receivers can be used and the analog image representation can then be digitized or scanned to generate a digital representation.

The camera 500 may also include a flash 560 to provide additional light when automatically or manually activated. The camera 500 may also include a light sensor 562 to measure the amount of ambient light. The camera 500 may also include a motion sensor 564, such as one or more gyroscopes. The motion sensor 564 may be useful for stabilizing the camera as a picture or video is being taken. The motion sensor may also be useful for later processing, including reducing blurring, of the image.

The camera 500 typically includes a user interface 552 that allows the user to operate the camera and to change various settings of the camera. The user interface 552 may also allow the user to view images (still or video) on the display 554 of the camera, set parameters related to the capture or processing or images, or send or receive images from the camera.

Camera 500 may optionally communicate with another device, such as a computer or mobile telephone, or with a wired or wireless network. External interface 550 can include a port for coupling the camera 500 to another device or may include circuitry for coupling camera 500 to one or more networks. This circuitry, if provided, may be constructed for use with one or more wired or wireless communication protocols.

Display 554 may be a liquid crystal display (LCD), light emitting diode (LED), or any other type of display. Display 554 may also include a touch sensitive screen arranged to receive input from an object such as a stylus or a digit from a human hand.

Memory 530 typically includes a RAM 532 and a ROM 534 and may include other storage devices. Memory 530 may store processor readable instructions, data structures, program modules or other data. Memory 530 further includes one or more permanent data storage 544, which can be utilized by camera 500 to store, among other things, applications 542, images (still or video), and/or other data. It will be understood that a portion of the memory 536 may be removable from the camera. For example, removable storage memory includes diskettes, memory sticks, memory cards, and the like.

Applications 542 may include computer executable instructions which, when executed by camera 500, control operation of the camera, process images, store images, or transmit or receive images. Applications 542 may further include an object recognition application 545 as discussed above. In other embodiments, as discussed above, the object recognition application may be resident on another device.

It will be understood that if the camera is part of another device, such as a mobile phone, PDA, or computer, components of the camera may be shared with other portions of the device. Shared components can include, but are not limited to, for example, the CPU, memory (including RAM, ROM, data storage, other storage, and applications), power supply, external interface(s), user interface, and display.

It will also be recognized that any portion of the methods described herein, including all portions relating to recognition of an object in an image, can be performed by a device other than a camera or a camera-containing device. For example, the recognition of an object in an image can be performed entirely, or partially, by a separate device such as a computer or the like.

The above specification, examples and data provide a description of the manufacture and use of the composition of the invention. Since many embodiments of the invention can be made without departing from the spirit and scope of the invention, the invention also resides in the claims hereinafter appended.

What is claimed as new and desired to be protected by Letters Patent of the United States is:

1. A method of face recognition, the method comprising:
    generating a recognition database for at least one identified face by obtaining multiple images for each identified face,
        for each identified face, selecting a subset of distinctive features from a set of features, wherein the subset includes no more than half of the features of the set and wherein each of the distinctive features in the subset have at least one calculated value representative of that distinctive feature of the identified face that exceeds a threshold level of distinction from at least one corresponding calculated value for a reference set of faces, at least one calculated value comprises a mean value and a variance for that distinctive feature, and
        for each identified face, recording in the recognition database the selected subset of distinctive features,
    obtaining an image of an unidentified face for recognition;
    for at least one identified face in the recognition database, calculating a comparison metric comparing at least a portion of the selected subset of distinctive features of that identified face with corresponding features for the unidentified face; and
    using the comparison metric for each of the at least one identified faces to determine if there is a correlation between the unidentified face and at least one identified face of the recognition database.

2. The method of claim 1, wherein the recognition database includes a plurality of identified faces and wherein the selected subset of distinctive features differs for at least two of the plurality of identified faces of the recognition database.

3. The method of claim 2, wherein for at least two of the identified faces there is no common distinctive feature in the selected subsets of distinctive features for those identified faces.

4. The method of claim 1, wherein the set of features comprises at least 100 features and wherein the subset of distinctive features for each identified face comprises at least five features.

5. The method of claim 1, wherein the comparison metric is a function of the mean values and variances for the portion of the selected subset of distinctive features.

6. The method of claim 1, wherein calculating a comparison metric comprises calculating the comparison metric for each identified face in the recognition database.

7. The method of claim 1, wherein calculating a comparison metric comprises calculating the comparison metric comparing all of the selected subset of distinctive features of that identified face with corresponding features for the unidentified face.

8. The method of claim 1, wherein selecting a subset of distinctive features comprises calculating, for each of a plurality of features in the set of features, a divergence of that feature for the identified face from a corresponding reference feature generated from the reference set of faces.

9. The method of claim 1, wherein selecting a subset of distinctive features comprises calculating, for each of a plurality of features in the set of features, a probability of detection of that feature of the identified face from the reference set of faces and a probability of a false positive of the feature of the identified face.

10. A method of object recognition, the method comprising:
    generating a recognition database for at least one identified object by obtaining multiple images for each identified object,
        for each identified object, selecting a subset of distinctive features from a set of features, wherein the subset includes no more than half of the features of the set and wherein each of the distinctive features in the subset have at least one calculated value representative of that feature of the identified object that exceeds a threshold level of distinction from at least one corresponding calculated value for a reference set of objects, at least one calculated value comprises a mean value and a variance for that distinctive feature, and
        for each identified object, recording in the recognition database the selected subset of distinctive features;
    obtaining an image of an unidentified object for recognition;
    for at least one identified object in the recognition database, calculating a comparison metric comparing at least a portion of the selected subset of distinctive features of that identified object with corresponding features for the unidentified object; and
    using the comparison metric for each of the at least one identified object to determine if there is a correlation between the unidentified object and the at least one identified object of the recognition database.

11. A system that is operative for face recognition, comprising:
    a recognition database stored on a computer-readable medium, the recognition database comprising, for at least one identified face, a subset of distinctive features for that identified face, wherein each of the distinctive features in the subset have at least one calculated value representative of that distinctive feature of the identified face that exceeds a threshold level of distinction from at least one corresponding calculated value for a reference set of faces, and at least one calculated value comprises a mean value and a variance for that distinctive feature;
    at least one processor for executing processor-readable instructions that enables actions, including:
        obtaining an image of an unidentified face for recognition;
        for at least one identified face in the recognition database, calculating a comparison metric comparing at least a portion of the subset of distinctive features of that identified face with corresponding features for the unidentified face; and
        using the comparison metric for each of the at least one identified faces to determine if there is a correlation between the unidentified face and the at least one identified face of the recognition database.

12. The system of claim 11, further comprising a processor for executing processor-readable instructions that enable actions, including:
generating the recognition database for the at least one identified face by obtaining multiple images for each identified face,
for each identified face, selecting the subset of distinctive features from a set of features, wherein the subset includes no more than half of the features of the set, and
for each identified face, recording in the recognition database the selected subset of distinctive features.

13. The system of claim 11, wherein the at least one processor executes processor-readable instructions that enable further actions, including:
generating the recognition database for a plurality of identified faces by obtaining multiple images for each of the plurality of identified faces,
for each of the plurality of identified faces, selecting the subset of distinctive features from a set of features, wherein the subset includes no more than half of the features of the set and wherein each of the distinctive features in the subset have at least one calculated value representative of that distinctive feature of the identified face that exceeds a threshold level of distinction from at least one corresponding calculated value for a reference set of faces, and
for each of the plurality of identified faces, recording in the recognition database the selected subset of distinctive features.

14. The system of claim 11, wherein the system is disposed on a device comprising a camera.

15. The system of claim 11, wherein the system further comprises a camera for obtaining the image with the unidentified face.

16. The system of claim 15, wherein at least one of the at least one processors is remote from the camera.

17. The system of claim 15, wherein the at least one processor is part of the camera.

18. The system of claim 15, wherein the camera is part of device selected from a computer, a mobile telephone, and a personal data assistant.

19. The system of claim 18, wherein the at least one processor is part of the device.

20. A non-transitory computer-readable medium having processor-executable instructions for face recognition, the processor-executable instructions when installed onto a device enable the device to perform actions, comprising:
generating the recognition database for at least one identified face by obtaining multiple images for each identified face,
for each identified face, selecting the subset of distinctive features from a set of features, wherein the subset includes no more than half of the features of the set and wherein each of the distinctive features in the subset have at least one calculated value representative of that distinctive feature of the identified face that exceeds a threshold level of distinction from at least one corresponding calculated value for a reference set of faces, at least one calculated value comprises a mean value and a variance for that distinctive feature, and
for each identified face, recording in the recognition database the selected subset of distinctive features
obtaining an image of an unidentified face for recognition;
for at least one identified face in a recognition database, calculating a comparison metric comparing at least a portion of a subset of distinctive features of that identified face with corresponding features for the unidentified face, wherein the subset of distinctive features differs for at least two of the multiple images of the identified face; and
using the comparison metric for each of the at least one identified faces to determine if there is a correlation between the unidentified face and the at least one identified face of the recognition database.

21. The non-transitory computer-readable medium of claim 20, wherein the set of features comprises at least 100 features and wherein the subset of distinctive features for each identified face comprises at least five features.

22. The non-transitory computer-readable medium of claim 20, wherein the recognition database comprises a plurality of identified faces and wherein for at least two of the identified faces there is no common distinctive feature in the selected subsets of distinctive features for those identified faces.

23. The non-transitory computer-readable medium of claim 20, wherein the comparison metric is a function of the mean values and variances for the portion of the selected subset of distinctive features.

24. The non-transitory computer-readable medium of claim 20, wherein calculating a comparison metric comprises calculating the comparison metric for each of the identified faces in the recognition database.

25. The non-transitory computer-readable medium of claim 20, wherein calculating a comparison metric comprises calculating the comparison metric comparing all of the selected subset of distinctive features of that identified face with corresponding features for the unidentified face.

26. The non-transitory computer-readable medium of claim 20, wherein selecting a subset of distinctive features comprises calculating, for each of a plurality of features in the set of features, a divergence of that feature for the identified face from a corresponding reference feature generated from the reference set of faces.

27. The non-transitory computer-readable medium of claim 20, wherein selecting a subset of distinctive features comprises calculating, for each of a plurality of features in the set of features, a probability of detection of that feature of the identified face from the reference set of faces and a probability of a false positive of the feature of the identified face.

* * * * *

UNITED STATES PATENT AND TRADEMARK OFFICE
CERTIFICATE OF CORRECTION

PATENT NO. : 8,160,309 B1  
APPLICATION NO. : 12/130704  
DATED : April 17, 2012  
INVENTOR(S) : Meir Tzur et al.

Page 1 of 1

It is certified that error appears in the above-identified patent and that said Letters Patent is hereby corrected as shown below:

Title Page 2, in column 2, line 41, under "Other Publications", delete "5203" and insert -- 5203: --, therefor.

Signed and Sealed this
Tenth Day of July, 2012

David J. Kappos
*Director of the United States Patent and Trademark Office*